(12) United States Patent
Sekiya

(10) Patent No.: US 10,576,608 B2
(45) Date of Patent: Mar. 3, 2020

(54) DRESSING BOARD, CUTTING BLADE DRESSING METHOD, AND CUTTING APPARATUS

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 233 days.

(21) Appl. No.: 15/873,578

(22) Filed: Jan. 17, 2018

(65) Prior Publication Data
US 2018/0200866 A1    Jul. 19, 2018

(30) Foreign Application Priority Data
Jan. 17, 2017    (JP) .................................. 2017-006006

(51) Int. Cl.
| | | |
|---|---|---|
| *B24B 53/14* | (2006.01) | |
| *H01L 21/78* | (2006.01) | |
| *H01L 21/304* | (2006.01) | |
| *B24B 53/017* | (2012.01) | |
| *H01L 21/683* | (2006.01) | |
| *B24B 3/36* | (2006.01) | |
| *B23Q 3/08* | (2006.01) | |
| *H01L 21/67* | (2006.01) | |

(52) U.S. Cl.
CPC .............. *B24B 53/14* (2013.01); *B23Q 3/088* (2013.01); *B24B 3/368* (2013.01); *B24B 53/017* (2013.01); *H01L 21/3043* (2013.01); *H01L 21/67092* (2013.01); *H01L 21/67294* (2013.01); *H01L 21/78* (2013.01); *H01L 21/6838* (2013.01)

(58) Field of Classification Search
CPC ....... B24B 53/14; B24B 3/368; B24B 53/017; B23Q 3/088; H01L 21/043; H01L 21/67092; H01L 21/67294; H01L 21/78; H01L 21/6838
See application file for complete search history.

(56) References Cited

U.S. PATENT DOCUMENTS

| | | | |
|---|---|---|---|
| 9,925,682 B2* | 3/2018 | Matsuyama | ........... B26D 7/018 |
| 10,022,838 B2* | 7/2018 | Akita | ....................... B24B 53/12 |
| 10,361,102 B2* | 7/2019 | Kaminaga | ............. H01L 21/683 |
| 2001/0044256 A1* | 11/2001 | Sekiya | ................. B23D 59/002 |
| | | | 451/5 |

FOREIGN PATENT DOCUMENTS

| | | |
|---|---|---|
| JP | 2011-11280 A | 1/2011 |
| JP | 2012-66328 A | 4/2012 |

* cited by examiner

*Primary Examiner* — Dung Van Nguyen
(74) *Attorney, Agent, or Firm* — Greer Burns & Crain Ltd.

(57) ABSTRACT

Disclosed herein is a dressing board for dressing a cutting blade. The dressing board is held on a chuck table in dressing the cutting blade. The dressing board includes a bar code formed on the front side of the dressing board for indicating kind information on the dressing board, and a groove code formed on the front side of the dressing board at an edge portion thereof, the groove code being composed of grooves having pattern corresponding to that of the bar code. Even when the bar code is cut off by the cutting blade in dressing the cutting blade, the kind information on the dressing board is indicated by the groove code left on the front side of the dressing board.

4 Claims, 9 Drawing Sheets

| KIND OF CUTTING BLADE | KIND OF DRESSING BOARD | KIND OF GROOVE CODE |
|---|---|---|
| CUTTING BLADES A TO D | DRESSING BOARD A | GROOVE CODE A |
| CUTTING BLADES E TO G | DRESSING BOARD B | GROOVE CODE B |
| CUTTING BLADES H TO J | DRESSING BOARD C | GROOVE CODE C |

RD

DRESSING BOARD, CUTTING BLADE DRESSING METHOD, AND CUTTING APPARATUS

BACKGROUND OF THE INVENTION

Field of the Invention

The present invention relates to a dressing board, a cutting blade dressing method, and a cutting apparatus.

Description of the Related Art

A cutting apparatus using a cutting blade is known as a processing apparatus for cutting various plate-shaped workpieces such as a semiconductor wafer and a packaged substrate with high accuracy. In the cutting apparatus, the cutting blade mounted on a spindle is subjected to dressing for the purposes of recovering the roundness and the cutting performance of the cutting blade. A dressing board is used to perform the dressing of the cutting blade. The dressing board is configured by mixing abrasive grains such as WA (white alundum, or alumina) and GC (green carbonite, or silicon carbide) in a bond formed of resin or ceramic. The dressing is performed by cutting the dressing board with the cutting blade, so that the cutting blade is worn to some extent (see Japanese Patent No. 5541657, for example).

The dressing board described in Japanese Patent No. 5541657 has a plurality of kinds because the bond and the abrasive grains are selected according to the kind of the cutting blade. Accordingly, if the dressing board is erroneously selected, that is, if the combination of the dressing board and the cutting blade is improper, there is a possibility that the roundness of the cutting blade cannot be recovered or the cutting blade may be dulled in cutting performance, resulting in a reduction in performance of the cutting blade. To cope with this problem, there has been developed a dressing board having a bar code, wherein the bar code formed on the dressing board mounted in a cutting apparatus is read into the cutting apparatus to identify the kind of the dressing board mounted in the cutting apparatus (see Japanese Patent Laid-open No. 2012-066328, for example).

SUMMARY OF THE INVENTION

In the dressing board described in Japanese Patent Laid-open No. 2012-066328, however, the bar code is formed on the front side of the dressing board, so that there is a possibility that the bar code may be removed by cutting the front side of the dressing board with the cutting blade. As a result, the kind of the dressing board mounted in the cutting apparatus cannot be identified. Further, when the front side of the dressing board is cut in a dressable area except the bar code, this dressable area is reduced to cause poor economy.

It is therefore an object of the present invention to provide a dressing board, a cutting blade dressing method, and a cutting apparatus which can ensure a large dressable area for dressing a cutting blade and can simultaneously identify the kind of the dressing board mounted in the cutting apparatus.

In accordance with an aspect of the present invention, there is provided a dressing board for dressing a cutting blade, the dressing board having a front side and a back side opposite to the front side, the back side of the dressing board being held on a chuck table in dressing the cutting blade, the dressing board including: a bar code formed on the front side of the dressing board for indicating kind information on the dressing board; and a groove code formed on the front side of the dressing board at an edge portion thereof, the groove code being composed of grooves having a pattern corresponding to that of the bar code. Even when the bar code is cut off by the cutting blade in dressing the cutting blade, the kind information on the dressing board is indicated by the groove code left on the front side of the dressing board.

Preferably, the kind information on the dressing board is indicated by using the width of each groove, the number of the grooves, the spacing between the grooves, and the length of each groove.

In accordance with another aspect of the present invention, there is provided a cutting blade dressing method of dressing a cutting blade by using a dressing board having a front side and a back side opposite to the front side, the front side having a bar code for indicating kind information on the dressing board, the cutting blade dressing method including: a holding step of holding the dressing board on a chuck table in the condition where the front side of the dressing board is exposed; a dressing board recording step of imaging the bar code of the dressing board held on the chuck table and next recording the kind information on the dressing board as included in the bar code, to a control unit of a cutting apparatus; a groove code deciding step of deciding a pattern of a groove code to be formed on the front side of the dressing board at an edge portion thereof, according to the kind information recorded in the dressing board recording step; a groove code forming step of forming the pattern of the groove code decided in the groove code deciding step, on the front side of the dressing board at the edge portion by using the cutting blade; and a dressing step of cutting the front side of the dressing board after performing the groove code forming step, by using the cutting blade, thereby dressing the cutting blade.

In accordance with a further aspect of the present invention, there is provided a cutting apparatus including: a chuck table for holding a workpiece; an auxiliary chuck table for holding a dressing board having a front side on which a bar code is formed, the bar code indicating kind information on the dressing board; a cutting unit having a cutting blade for cutting the workpiece held on the chuck table; an imaging unit for imaging the workpiece held on the chuck table and also imaging the bar code of the dressing board; and a control unit for controlling the chuck table, the auxiliary chuck table, the cutting unit, and the imaging unit. The control unit includes: a bar code determining section for operating the imaging unit to image the bar code of the dressing board held on the auxiliary chuck table and determining the kind information on the dressing board as included in the bar code; and a groove code forming section for converting the kind information included in the bar code into a pattern of a groove code and forming the groove code corresponding to the bar code at an edge portion of the dressing board.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will now be described in detail with reference to the drawings. The present invention is not limited to this preferred embodiment. Further, the components used in this preferred embodiment may include those that can be easily assumed by persons skilled in the art or substantially the same elements as those known in the art. Further, the configurations described below may be suitably combined. Further, the configurations may be variously omitted, replaced, or changed without departing from the scope of the present invention.

Figure 1:
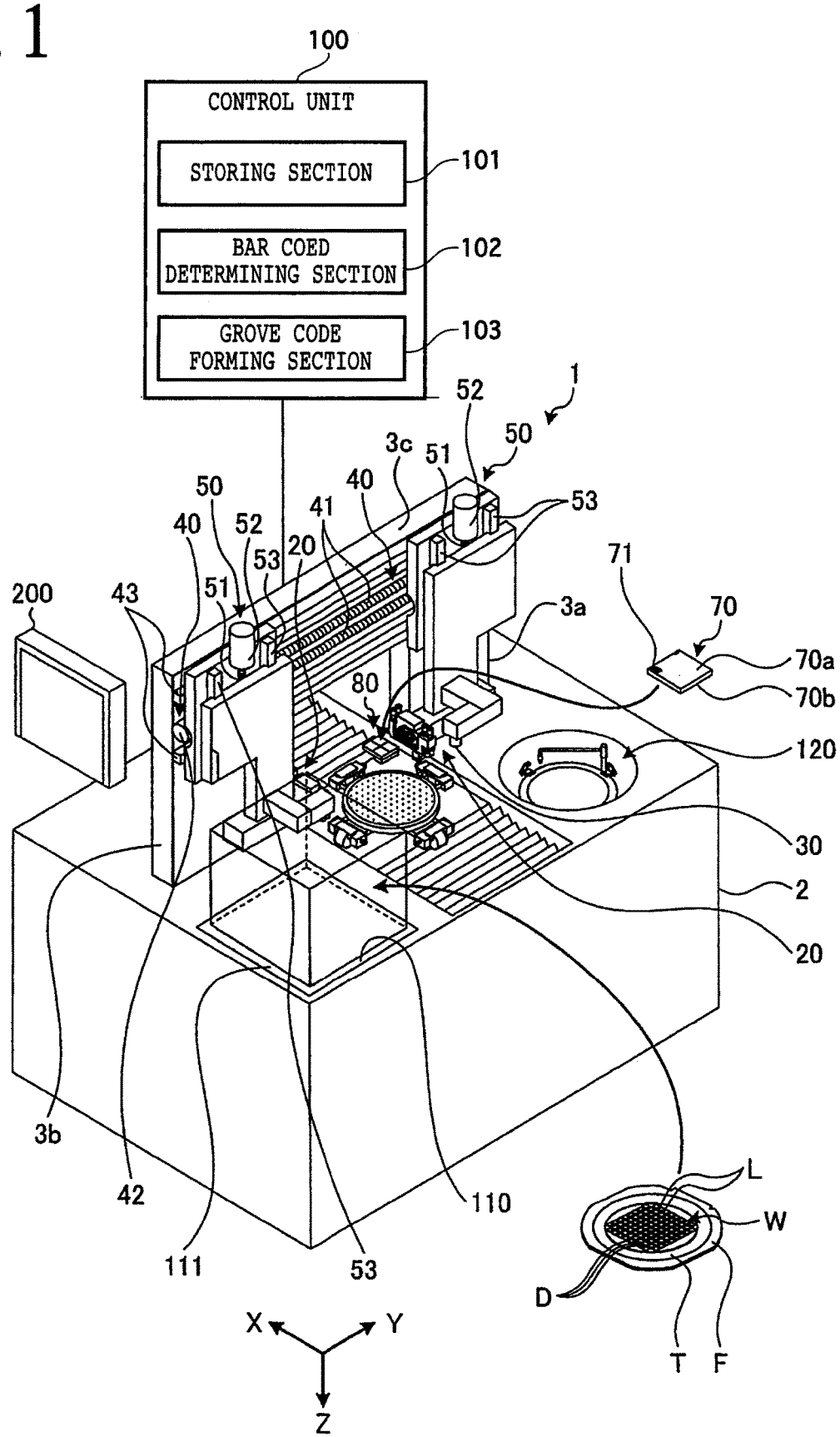
FIG. 1 is a perspective view depicting the configuration of a cutting apparatus according to a preferred embodiment of the present invention.

Referring to FIG. 1, there is depicted a cutting apparatus 1 according to a preferred embodiment of the present invention. The cutting apparatus 1 is an apparatus for cutting (processing) a platelike workpiece W. In this preferred embodiment, the workpiece W is a disk-shaped semiconductor wafer or optical device wafer formed of silicon, sapphire, or gallium arsenide, for example, as a base material. The workpiece W has a front side WS and a back side WR. A plurality of crossing division lines L are formed on the front side WS of the wafer W to thereby define a plurality of separate regions where a plurality of devices D are formed. As a modification, the workpiece W may be a so-called TAIKO wafer having a thin central portion and a thick peripheral portion. Further, the workpiece W may be a rectangular packaged substrate having a plurality of devices sealed with resin, rather than a disk-shaped wafer. Further, the workpiece W may be a ceramic plate or a glass plate, for example. An adhesive tape T as a protective member is attached at its central portion to the back side WR of the workpiece W. An annular frame F is mounted on a peripheral portion of the adhesive tape T.

The cutting apparatus 1 is an apparatus for cutting the workpiece W along the division lines L by using a cutting blade 21 (see FIG. 2) in the condition where the workpiece W is held on a chuck table 10. As depicted in FIG. 1, the cutting apparatus 1 includes the chuck table 10 having a holding surface 10a (see FIG. 2) for holding the workpiece W under suction, a pair of cutting units 20 each having the cutting blade 21 for cutting the workpiece W held on the chuck table 10, an imaging unit 30 for imaging the workpiece W held on the chuck table 10, and a control unit 100.

As depicted in FIG. 1, the cutting apparatus 1 further includes a base housing 2, an X moving unit (not depicted) for moving (feeding) the chuck table 10 in the X direction depicted by an arrow X, the X direction being parallel to a horizontal direction and a lateral direction of the base housing 2, a pair of Y moving units 40 for moving (indexing) the pair of cutting units 20 in the Y direction depicted by an arrow Y, the Y direction being parallel to a horizontal direction and a longitudinal direction of the base housing 2 and perpendicular to the X direction, and a pair of Z moving units 50 for moving (feeding) the pair of cutting units 20 in the Z direction depicted by an arrow Z, the Z direction being parallel to a vertical direction perpendicular to both the X direction and the Y direction. Thus, the cutting apparatus 1 is a dual spindle type dicing saw having the two cutting units 20, or a so-called facing dual type cutting apparatus.

The chuck table 10 is a disk-shaped member, and the holding surface 10a for holding the workpiece W is formed of porous ceramic, for example. The chuck table 10 is movable by the X moving unit and also rotatable by a rotational drive source (not depicted). The chuck table 10 is connected to a vacuum source (not depicted), so that the workpiece W can be held on the holding surface 10a under suction by a vacuum applied from the vacuum source.

Each cutting unit 20 includes a spindle (not depicted) on which the cutting blade 21 is mounted to cut the workpiece W held on the chuck table 10. Each cutting unit 20 is movable in the Y direction by the corresponding Y moving unit 40 and also movable in the Z direction by the corresponding Z moving unit 50, relative to the workpiece W held on the chuck table 10.

A pair of columns 3a and 3b stand from the upper surface of the base housing 2. The columns 3a and 3b are connected at their upper ends by a horizontal bar 3c. One of the two cutting units 20 is supported through the corresponding Y moving unit 40 and the corresponding Z moving unit 50 to the column 3a. The other cutting unit 20 is supported through the corresponding Y moving unit 40 and the corresponding Z moving unit 50 to the column 3b.

Each cutting unit 20 is adapted to be moved by the corresponding Y moving unit 40 and the corresponding Z moving unit 50, thereby setting the corresponding cutting blade 21 at an arbitrary position on the holding surface 10a of the chuck table 10. The imaging unit 30 for imaging the front side WS of the workpiece W held on the chuck table 10 is integrated with one of the two cutting units 20 so as to be movable together therewith. The imaging unit 30 includes a CCD (charge coupled device) camera for imaging a target area of the workpiece W to be cut by the cutting blade 21 in the condition where the workpiece W is held on the chuck table 10. The CCD camera functions to image the workpiece W held on the chuck table 10 and obtain an image for use in performing the alignment between the workpiece W and the cutting blade 21, then outputting this image to the control unit 100.

The cutting blade 21 of each cutting unit 20 is a thin ringlike cutting wheel. By rotating the spindle, the cutting blade 21 mounted on the spindle is rotated to cut the workpiece W. The spindle is rotatably mounted in a spindle housing (not depicted) supported to the Z moving unit 50. The axis of the spindle, or the axis of the cutting blade 21 extends in the Y direction.

The X moving unit functions to move the chuck table 10 in the X direction as a work feeding direction, thereby relatively moving the chuck table 10 and each cutting unit 20 in the X direction. Each Y moving unit 40 functions to move the corresponding cutting unit 20 in the Y direction as an indexing direction, thereby relatively moving the chuck table 10 and the corresponding cutting unit 20 in the Y direction. Each Z moving unit 50 functions to move the corresponding cutting unit 20 in the Z direction as a cutter feeding direction, thereby relatively moving the chuck table 10 and the corresponding cutting unit 20 in the Z direction.

Although not depicted, the X moving unit includes a known ball screw rotatable about its axis extending in the X direction, a known pulse motor for rotating the ball screw about its axis, and a pair of parallel guide rails for movably supporting the chuck table 10 in such a manner that the chuck table 10 is movable in the X direction by rotating the ball screw. Similarly, each Y moving unit 40 includes a known ball screw 41 rotatable about its axis extending in the Y direction, a known pulse motor 42 for rotating the ball screw 42 about its axis, and a pair of parallel guide rails 43 for movably supporting the corresponding cutting unit 20 in such a manner that the cutting unit 20 is movable in the Y direction by rotating the ball screw 41. Similarly, each Z moving unit 50 includes a known ball screw 51 rotatable about its axis extending in the Z direction, a known pulse motor 52 for rotating the ball screw 51 about its axis, and a pair of parallel guide rails 53 for movably supporting the corresponding cutting unit 20 in such a manner that the cutting unit 20 is movable in the Z direction by rotating the ball screw 51.

Although not depicted, the cutting apparatus 1 further includes an X position detecting unit for detecting the X position of the chuck table 10 as the position in the X direction, a Y position detecting unit for detecting the Y position of each cutting unit 20 as the position in the Y direction, and a Z position detecting unit for detecting the Z position of each cutting unit 20 as the position in the Z direction. The X position detecting unit may be composed of a linear scale parallel to the X direction and a read head for reading the linear scale. Similarly, the Y position detecting unit may be composed of a linear scale parallel to the Y direction and a read head for reading the linear scale. The Z position detecting unit may be configured by using the pulses output from the pulse motor 52 to thereby detect the Z position of each cutting unit 20 according to the output pulses. Detection signals output from the X position detecting unit, the Y position detecting unit, and the Z position detecting unit are transmitted to the control unit 100.

Figure 2:
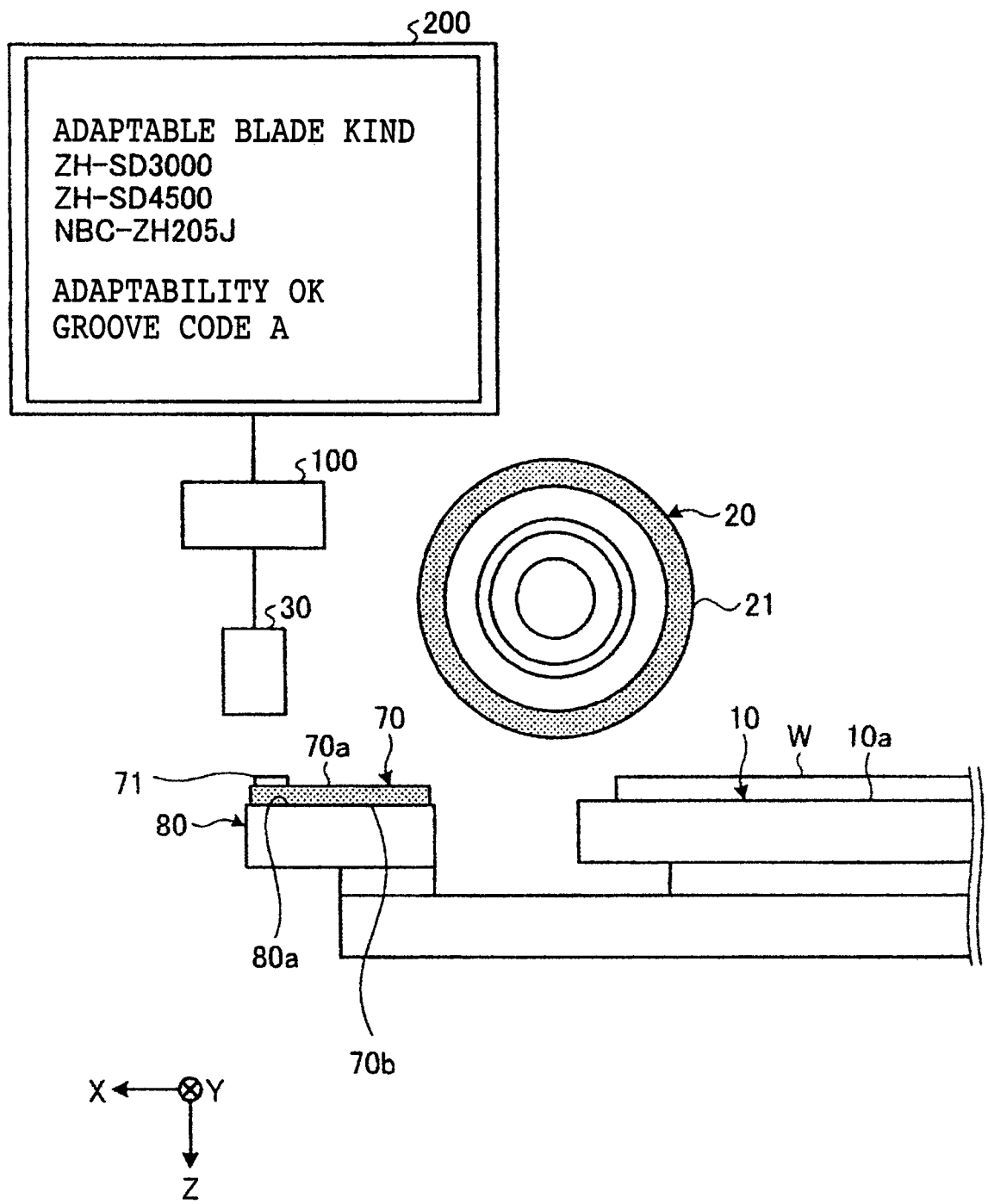
FIG. 2 is a side view depicting an essential part of the cutting apparatus depicted in FIG. 1.

As depicted in FIGS. 1 and 2, the cutting apparatus 1 further includes an auxiliary chuck table 80 for detachably mounting a dressing board 70. The auxiliary chuck table 80 is movable in the X direction together with the chuck table 10 and also rotatable by a rotational drive source (not depicted). The auxiliary chuck table 80 is a rectangular member and has an upper surface 80a for mounting the dressing board 70. The upper surface 80a of the auxiliary chuck table 80 is set at the same level as that of the holding surface 10a of the chuck table 10. The auxiliary chuck table 80 is connected to a vacuum source (not depicted), so that the dressing board 70 can be held on the upper surface 80a under suction by a vacuum applied from the vacuum source. Thus, the auxiliary chuck table 80 is a chuck table for holding the dressing board 70.

The dressing board 70 functions to dress the cutting blade 21 reduced in its cutting performance due to loading or dulling, thereby restoring the cutting performance of the cutting blade 21. Thus, dressing the cutting blade 21 means restoring the cutting performance of the cutting blade 21. That is, the dressing board 70 is a board for dressing the cutting blade 21 in such a manner that the dressing board 70 held on the auxiliary chuck table 80 is cut by the cutting blade 21.

The dressing board 70 is a rectangular plate having substantially the same shape as that of the upper surface 80a of the auxiliary chuck table 80 as viewed in plan. The dressing board 70 is configured by mixing abrasive grains such as WA (white alundum, or alumina) and GC (green carbonite, or silicon carbide) in a bond formed of resin or ceramic.

Figure 3:
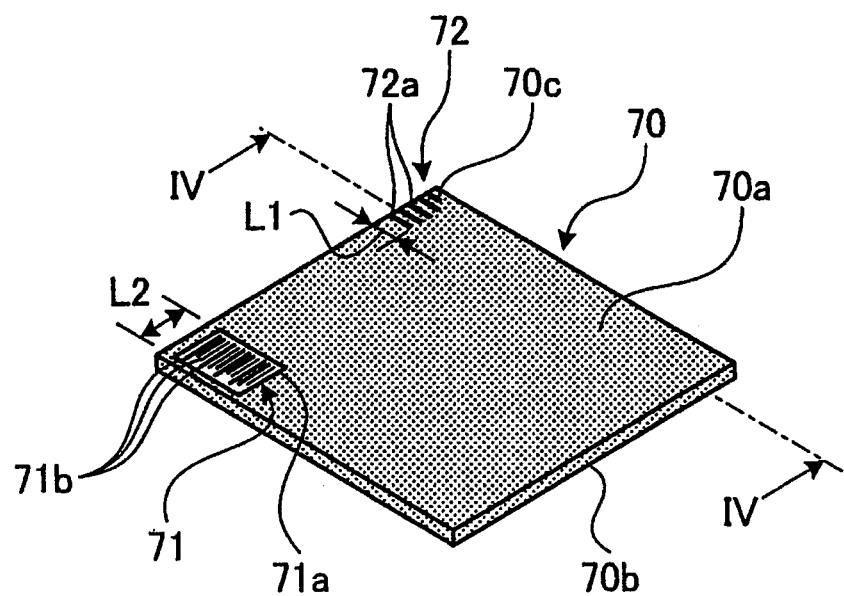
FIG. 3 is a perspective view depicting a dressing board according to this preferred embodiment.

As depicted in FIG. 3, the dressing board 70 has a front side (upper surface) 70a and a back side (lower surface) 70b opposite to the front side 70a, the back side 70b being adapted to be held on the upper surface 80a of the auxiliary chuck table 80. A bar code 71 and a groove code 72 are provided on the front side 70a of the dressing board 70. The bar code 71 indicates kind information on the dressing board 70. That is, the kind information means information on the kind (model) etc. of the dressing board 70. The bar code 71 is a so-called one-dimensional bar code composed of a base sheet 71a formed of paper or plastic and attached to the front side 70a and a plurality of parallel straight lines 71b formed on the front side (upper surface) of the base sheet 71a. The plural parallel straight lines 71b indicate the kind (model) etc. of the dressing board 70. The cutting blade 21 is allowed to also cut the bar code 71 of the dressing board 70.

Figure 4:
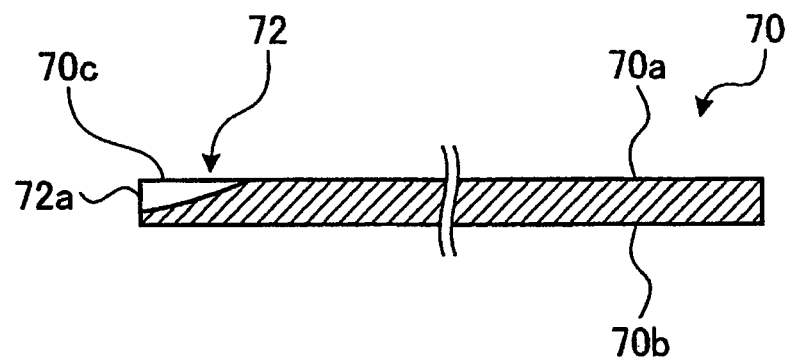
FIG. 4 is a cross section taken along the line IV-IV in FIG. 3.

The groove code 72 is formed on the front side 70a of the dressing board 70 at a corner portion 70c as an edge portion. The groove code 72 indicates the information corresponding to the bar code 71 (i.e., the kind information on the dressing board 70). The groove code 72 is composed of at least one groove 72a. In this preferred embodiment, a plurality of grooves 72a are formed on the front side 70a of the dressing board 70 as depicted in FIG. 3. Each groove 72a is formed by linearly cut the front side (upper surface) 70a of the dressing board 70 so as to extend to the side surface of the dressing board 70 as depicted in FIG. 4. Each groove 72a is formed in such a manner that the front side 70a of the dressing board 70 at the corner portion 70c is cut by the cutting blade 21. In the case that the groove code 72 is composed of the plural grooves 72a as in this preferred embodiment, the plural grooves 72a are arranged in parallel. The kind information on the dressing board 70 is indicated by using the width of each groove 72a, the number of the grooves 72a, the spacing between the grooves 72a, and the length of each groove 72a. The length L1 of the longest one of the plural grooves 72a constituting the groove code 72 is set shorter than the length L2 of the longest one of the plural straight lines 71b constituting the bar code 71.

The control unit 100 functions to control each component of the cutting apparatus 1 and thereby to perform the processing operation to the workpiece W under control. In this preferred embodiment, the control unit 100 is a computer. The control unit 100 is connected to a display unit 200 such as a liquid crystal display for displaying the condition of the processing operation, the image of the workpiece W, etc. The control unit 100 is also connected to an input unit (not depicted) adapted to be operated by an operator in recording the information on the processing of the workpiece W. This input unit is configured by a touch panel provided in the display unit 200 and/or an external input unit such as a keyboard.

As depicted in FIG. 1, the control unit 100 includes a storing section 101, a bar code determining section 102, and a groove code forming section 103. The storing section 101 previously stores recorded data RD depicted in FIG. 5. The recorded data RD indicates the correspondence among the kind of the cutting blade 21, the kind of the dressing board 70, and the kind of the groove code 72 in dressing the cutting blade 21 with the dressing board 70 adapted thereto. The correspondence between the cutting blade 21 and the dressing board 70 as indicated by the recorded data RD means the adaptation of the dressing board 70 to the cutting blade 21 to be dressed by the dressing board 70.

The bar code determining section 102 functions to determine (identify) the kind information on the dressing board 70, i.e., the information on the kind of the dressing board 70, wherein the kind information is included in the bar code 71, according to an image of the bar code 71 as obtained by the imaging unit 30. That is, the bar code 71 formed on the exposed front side 70a of the dressing board 70 held on the auxiliary chuck table 80 is imaged by the imaging unit 30, and the image of the bar code 71 obtained by the imaging unit 30 is sent to the bar code determining section 102.

The groove code forming section 103 functions to convert the kind information included in the bar code 71 and determined by the bar code determining section 102, into the groove code 72 and then form the groove code 72 corresponding to the bar code 71 at the corner portion 70c as an edge portion of the dressing board 70 by using the cutting blade 21 under control. That is, the groove code forming section 103 functions to refer to the recorded data RD depicted in FIG. 5 and then determine the kind of the groove code 72 corresponding to the kind information on the dressing board 70 as included in the bar code 71 and determined by the bar code determining section 102. The groove code forming section 103 further functions to control the cutting blade 21 and form the groove code 72 determined above at the corner portion 70c as an edge portion of the dressing board 70 by using the cutting blade 21.

Figures 5, 6:
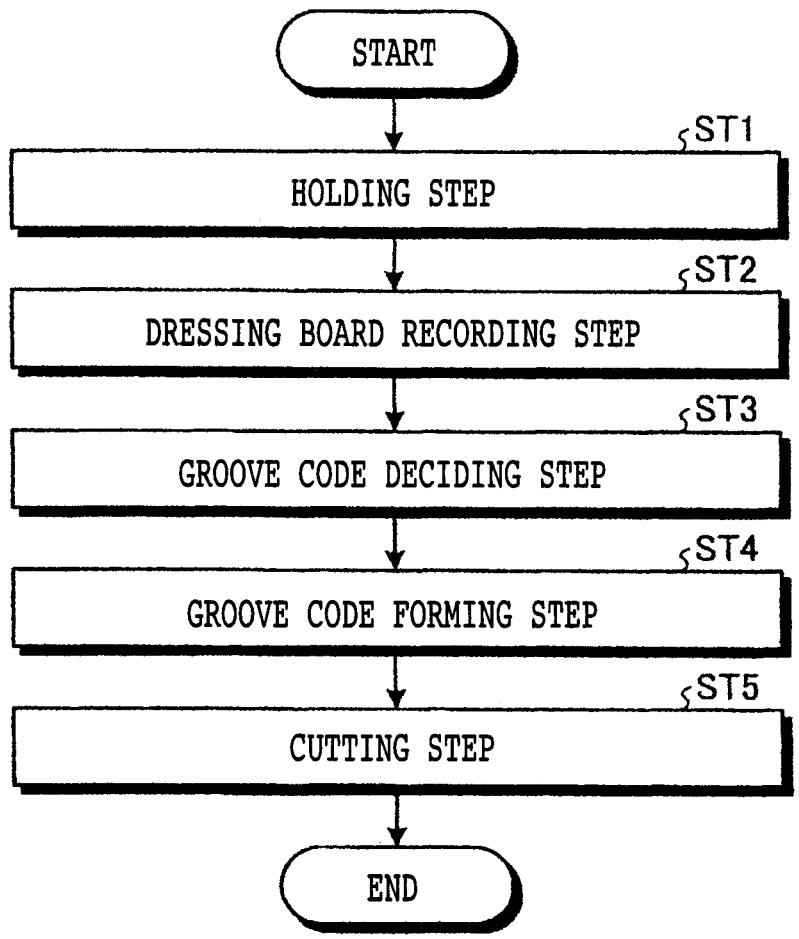
FIG. 5 is a table depicting recorded data stored in a control unit included in the cutting apparatus depicted in FIG. 1.
FIG. 6 is a flowchart depicting a part of the flow of a cutting blade dressing method according to this preferred embodiment.

The control unit 100 functions to determine whether or not the cutting blade 21 mounted on the spindle is a cutting blade of the kind corresponding to the kind of the dressing board 70 held on the auxiliary chuck table 80, by referring to the recorded data RD depicted in FIG. 5. In other words, the control unit 100 functions to determine whether or not the cutting blade 21 mounted on the spindle is adapted to the dressing using the dressing board 70 held on the auxiliary chuck table 80.

The cutting apparatus 1 further includes a cassette elevator 110 for mounting a cassette 111 thereon and moving the cassette 111 in the Z direction, wherein a plurality of workpieces W are stored in the cassette 111 before and after performing the cutting operation in the cutting apparatus 1. The cutting apparatus 1 further includes a cleaning unit 120 for cleaning each workpiece W after performing the cutting operation and a transfer unit (not depicted) for drawing the workpiece W from the cassette 111 before cutting, storing the workpiece W into the cassette 111 after cutting, and transferring the workpiece W to a predetermined position.

Figure 7:
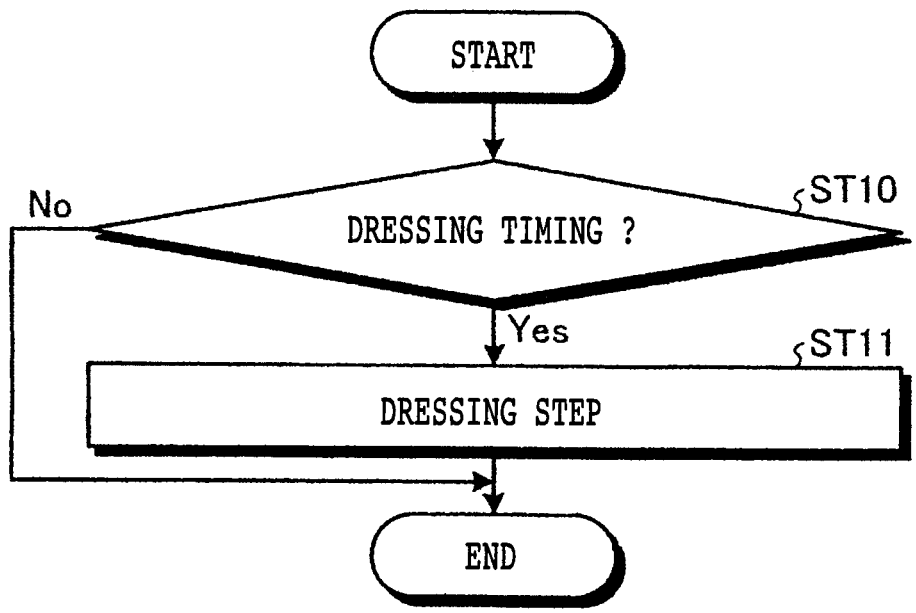
FIG. 7 is a flowchart depicting the remainder of the flow of the cutting blade dressing method.
Figure 8:
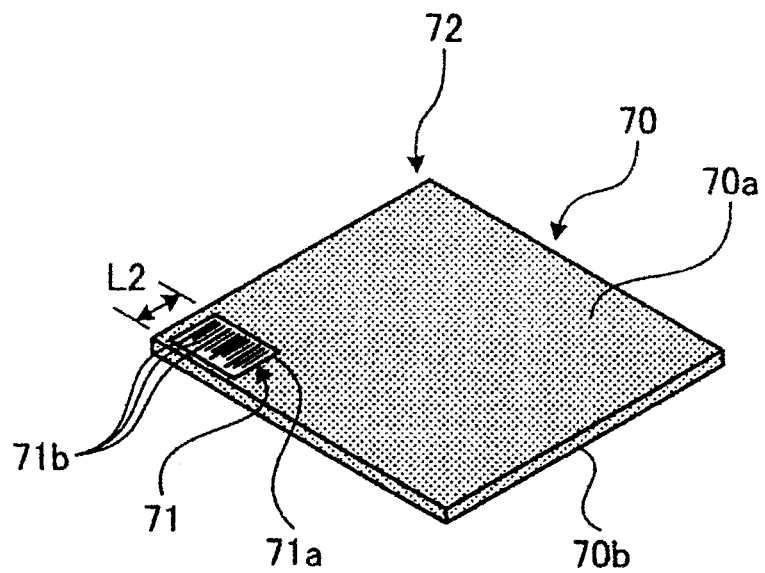
FIG. 8 is a perspective view depicting an original dressing board to be held in a holding step constituting the cutting blade dressing method depicted in FIG. 6.
Figure 9:
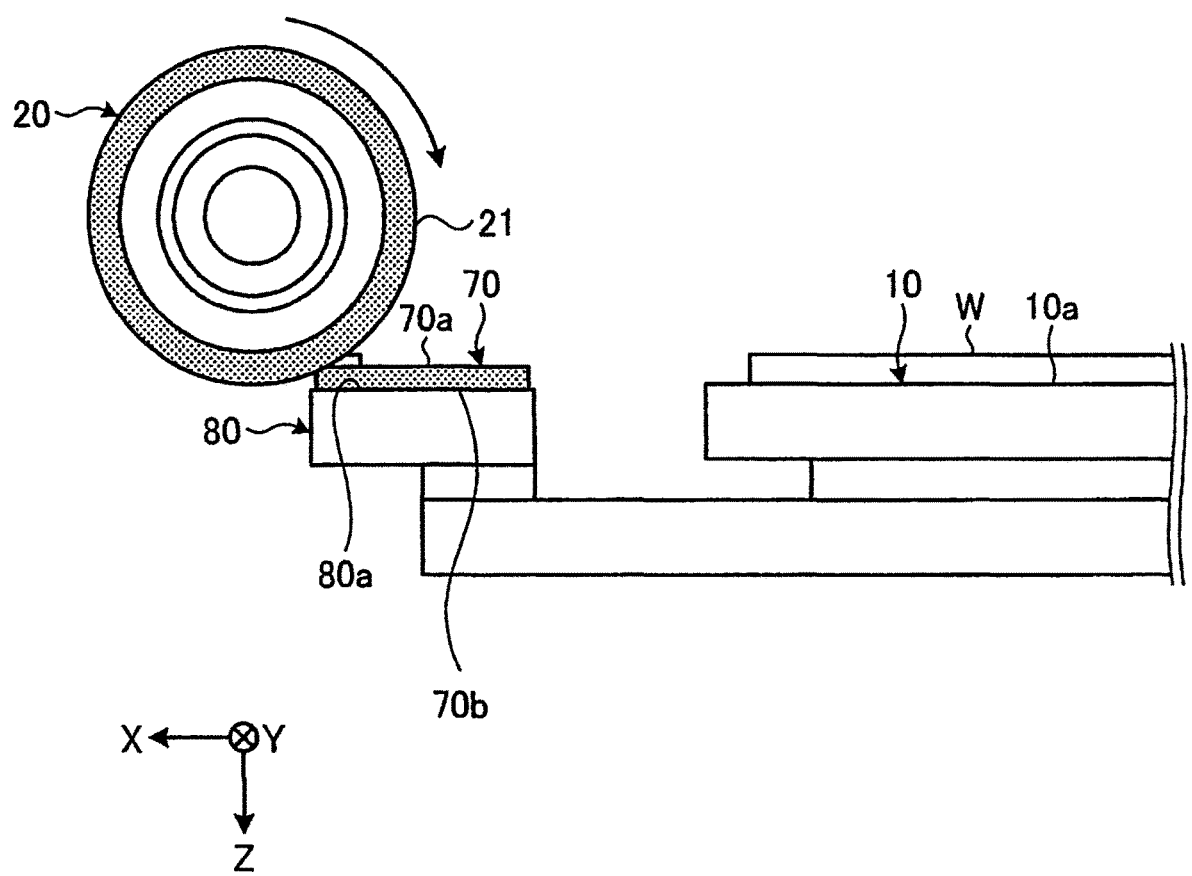
FIG. 9 is a side view depicting a groove code forming step constituting the cutting blade dressing method depicted in FIG. 6.
Figure 10:
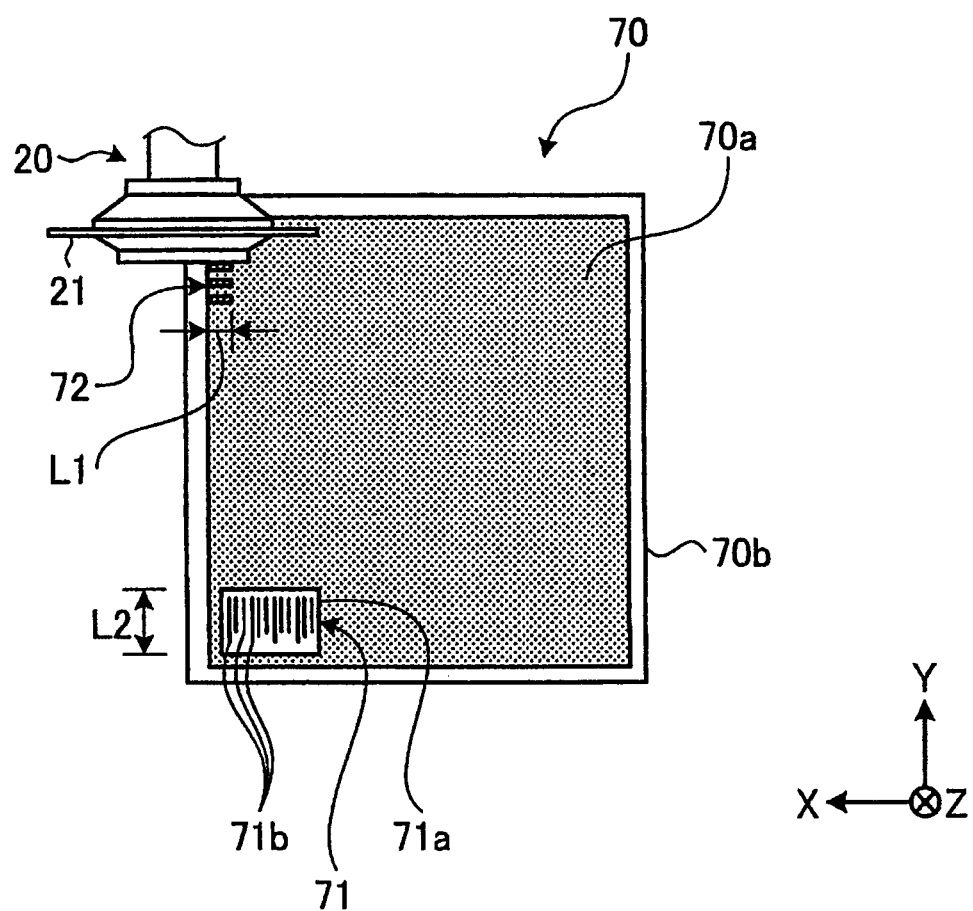
FIG. 10 is a plan view depicting the groove code forming step depicted in FIG. 9.
Figure 11:
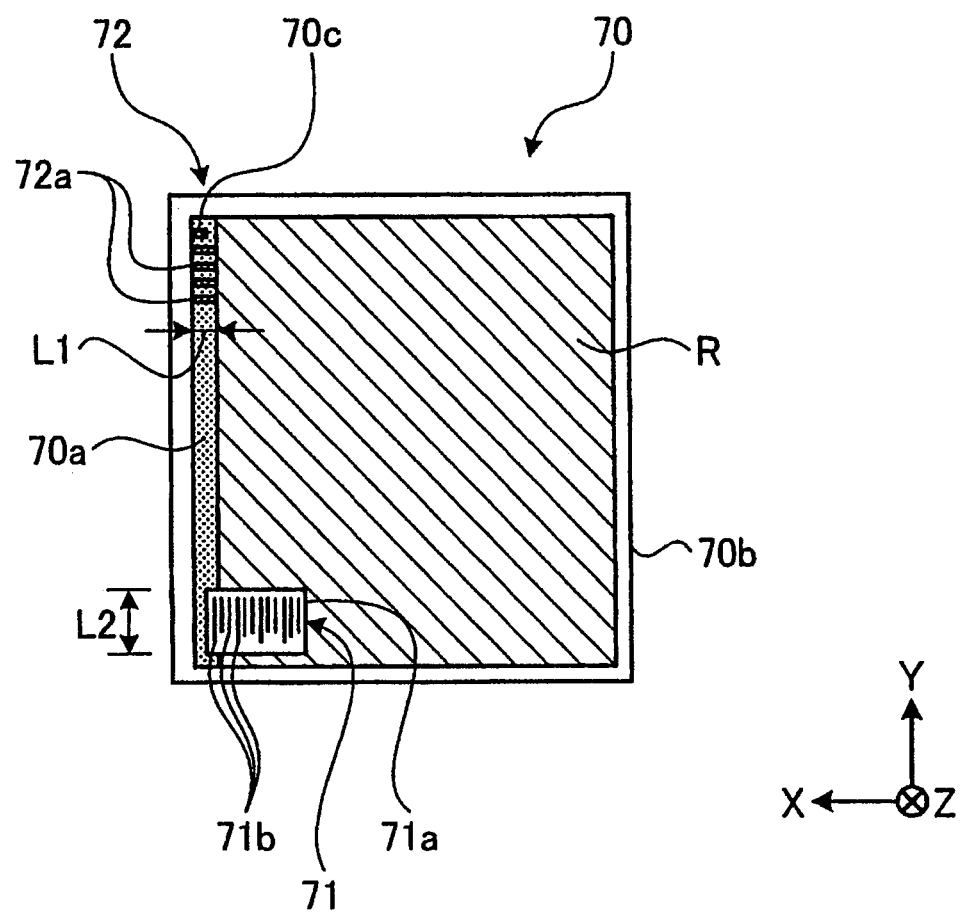
FIG. 11 is a plan view depicting a dressing board having a groove code formed by the groove code forming step depicted in FIGS. 9 and 10.
Figure 12:
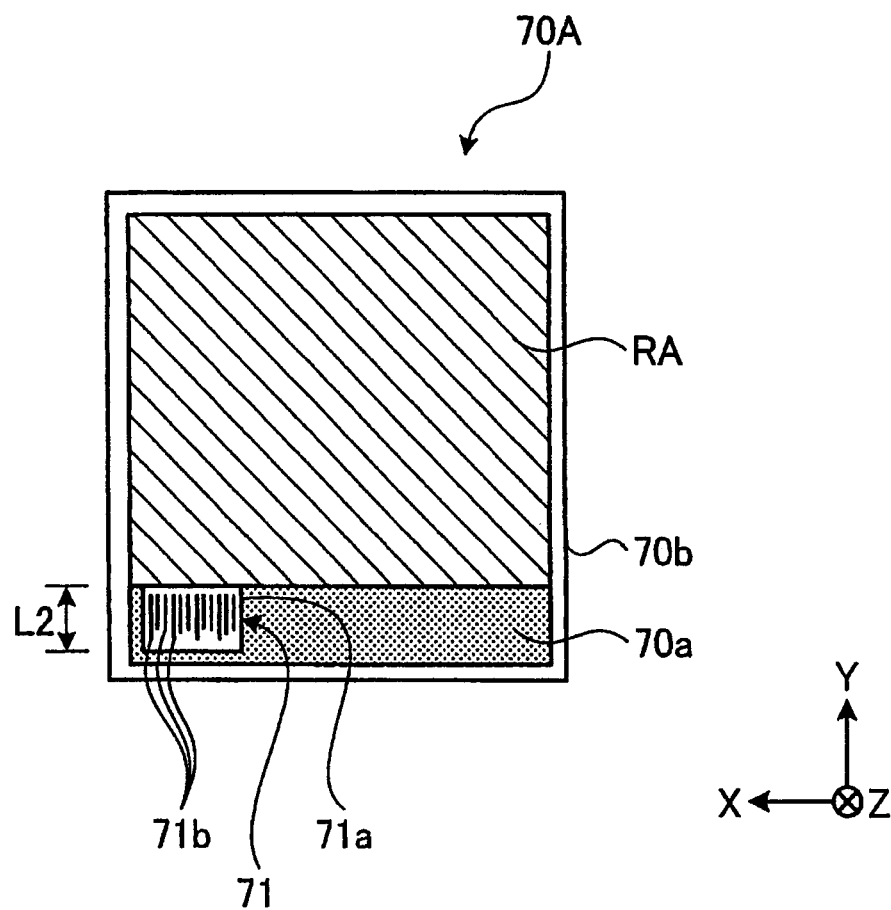
FIG. 12 is a plan view depicting a dressing board having no groove code as a comparison.

There will now be described the operation of the cutting apparatus 1 according to this preferred embodiment, that is, a cutting blade dressing method according to this preferred embodiment with reference to the drawings. FIG. 6 is a flowchart depicting a part of the flow of the cutting blade dressing method according to this preferred embodiment. FIG. 7 is a flowchart depicting the remainder of the flow of the cutting blade dressing method according to this preferred embodiment. FIG. 8 is a perspective view depicting an original dressing board to be held in a holding step constituting the cutting blade dressing method depicted in FIG. 6. FIG. 9 is a side view depicting a groove code forming step constituting the cutting blade dressing method depicted in FIG. 6. FIG. 10 is a plan view depicting the groove code forming step depicted in FIG. 9. FIG. 11 is a plan view of the dressing board on which the groove code has been formed by the groove code forming step depicted in FIGS. 9 and 10. FIG. 12 is a plan view similar to FIG. 11, depicting a comparison.

The cutting blade dressing method which will be hereinafter referred to simply as "dressing method") according to this preferred embodiment is a dressing method using the cutting apparatus 1 depicted in FIG. 1 and this method is included in a cutting method for the workpiece W. Prior to starting the dressing method, the information on the processing of the workpiece W is recorded into the control unit 100 by the operator, and the dressing board 70 is set on the upper surface 80a of the auxiliary chuck table 80 by the operator. When starting of the processing is instructed by the operator, the dressing method is started. The information on the processing of the workpiece W includes the kind (model) of the cutting blade 21 mounted on the spindle of the cutting unit 20. More specifically, the cassette 111 storing the plural workpieces W to be cut is first set on the cassette elevator 110 by the operator. Further, the dressing board 70 is set on the upper surface 80a of the auxiliary chuck table 80 by the operator, wherein the dressing board 70 at this time is an original dressing board having no groove code. When starting of the processing is next instructed by the operator, the dressing method is started by the control unit 100.

As depicted in FIG. 6, the dressing method includes a holding step ST1, dressing board recording step ST2, groove code deciding step ST3, groove code forming step ST4, cutting step ST5, and dressing step ST11 (see FIG. 7).

The holding step ST1 is the step of holding the dressing board 70 on the auxiliary chuck table 80 in the condition where the front side 70a having the bar code 71 is exposed as depicted in FIG. 8, before forming the groove code 72 on the front side 70a. In the holding step ST1, the control unit 100 operates the vacuum source connected to the auxiliary chuck table 80 to thereby hold the dressing board 70 on the upper surface 80a of the auxiliary chuck table 80.

The dressing board recording step ST2 is the step of imaging the bar code 71 of the dressing board 70 held on the auxiliary chuck table 80 by using the imaging unit 30 and then recording the kind information included in the bar code 71 of the dressing board 70 to the control unit 100. In the dressing board recording step ST2, the control unit 100 controls the X moving unit and the Y moving unit 40 to make the imaging unit 30 be opposed to the bar code 71 of the dressing board 70, then operating the imaging unit 30 to image the bar code 71. Thereafter, the bar code determining section 102 in the control unit 100 determines (identifies) the kind of the dressing board 70 indicated by the bar code 71, according to the image obtained by the imaging unit 30 and then stores the kind of the dressing board 70 determined above.

The groove code deciding step ST3 is the step of deciding the pattern of the groove code 72 to be formed at the corner portion 70c of the dressing board 70, according to the information recorded in the dressing board recording step ST2. In the groove code deciding step ST3, the groove code forming section 103 in the control unit 100 refers to the recorded data RD to identify the kind of the groove code 72 corresponding to the kind of the dressing board 70 determined in the dressing board recording step ST2. Further, in the groove code deciding step ST3, the control unit 100 refers to the information on the processing of the workpiece W as previously input, the kind of the dressing board 70 as determined in the dressing board recording step ST2, and the recorded data RD and then determines whether or not the dressing board 70 held on the auxiliary chuck table 80 is adapted to the dressing of the cutting blade 21 mounted on the spindle. Thereafter, as depicted in FIG. 2, the control unit 100 controls the display unit 200 to display the kind of the groove code 72 identified above, the adaptability or non-adaptability between the dressing board 70 and the cutting blade 21, and the kind of the cutting blade 21 adaptable to the kind of the dressing board 70 determined in the dressing board recording step ST2.

The groove code forming step ST4 is the step of forming the pattern of the groove code 72 as decided in the groove code deciding step ST3 at the corner portion 70c of the dressing board 70 by using the cutting blade 21. In the groove code forming step ST4, the control unit 100 controls the X moving unit, the Y moving unit 40, and the Z moving unit 50 to cut the corner portion 70c of the dressing board 70 by operating the cutting blade 21 as depicted in FIGS. 9 and 10, thereby forming the groove code 72 of the kind decided by the groove code deciding step ST3.

The cutting step ST5 is the step of cutting the workpiece W held on the chuck table 10 by using the cutting blade 21. In the cutting step ST5, the control unit 100 controls the transfer unit to take one of the plural workpieces W out of the cassette 11 and then transfer the workpiece W to the chuck table 10, then holding the workpiece W through the adhesive tape T on the holding surface 10a of the chuck table 10 under suction. Thereafter, the control unit 10 controls the X moving unit to move the chuck table 10 to the position below one of the two cutting units 20. Further, the workpiece W held on the chuck table 10 is positioned directly below the imaging unit 30 located adjacent to this cutting unit 20, and the workpiece W is imaged by the imaging unit 30. Thereafter, the control unit 100 performs image processing such as pattern matching for performing the alignment between any target one of the division lines L of the workpiece W held on the chuck table 10 and the cutting blade 21 of the cutting unit 20, and then adjusts the relative position between the workpiece W held on the chuck table 10 and the cutting unit 20.

Thereafter, the control unit 100 controls the X moving unit, the Y moving unit 40, the Z moving unit 50, and the rotational drive source to relatively move the cutting blade 21 and the workpiece W along the target division line L according to the information on the processing of the workpiece W, thereby cutting the workpiece W along the target division line L.

Thereafter, the workpiece W is similarly cut along all of the other division lines L to thereby divide the workpiece W into individual device chips corresponding to the respective devices D. Thereafter, the chuck table 10 is retracted from the position below the cutting unit 20, and the suction holding of the workpiece W on the chuck table 10 is next canceled. Thereafter, the workpiece W is transferred to the cleaning unit 120 to clean the workpiece W in the cleaning unit 120. Thereafter, the workpiece W thus processed is returned to the cassette 111 by the transfer unit. This cutting step ST5 is repeated to sequentially perform the cutting operation to all of the other workpieces W stored in the cassette 11. When the cutting operation to all the workpieces W stored in the cassette 111 is finished, the operation by the cutting apparatus 1 is ended.

During the cutting step ST5, the control unit 100 determines whether or not dressing timing has been reached (step ST10). When the control unit 100 determines that the dressing timing has not been reached (step ST10: No), the step ST10 is repeated. This dressing time means the timing for dressing the cutting blade 21. For example, the dressing timing is set as the timing when cutting of the workpiece W along a predetermined number of division lines L has been finished. As a modification, the dressing timing may be set as any arbitrary timing during the processing of one workpiece W or as the timing when the workpiece W is replaced by another workpiece W in sequentially performing the cutting operation to the plural workpieces W.

In contrast, when the control unit 100 determines that the dressing timing has been reached (step ST10: Yes), the dressing step ST11 is performed to cut the front side 70a of the dressing board 70 having the groove code 72 by using the cutting blade 21, thereby dressing the cutting blade 21. In the dressing step ST11, the control unit 100 controls the X moving unit, the Y moving unit 40, and the Z moving unit 50 to cut the front side 70a of the dressing board 70 with the cutting blade 21, thereby dressing the cutting blade 21. As depicted in FIG. 11, the cutting blade 21 is dressed in an area R depicted as a hatched area on the front side 70a of the dressing board 70, wherein this area R does not include the groove code 72, but includes at least a part of the bar code 71. Accordingly, even when the bar code 71 is cut off by the cutting blade 21 in the dressing step ST11, the groove code 72 left on the front side 70a of the dressing board 70 can indicate the kind information on the dressing board 70. After performing the dressing step ST11, the program returns to the step ST10.

According to the dressing board 70, the dressing method, and the cutting apparatus 1 as described above, the groove code 72 having a pattern corresponding to the bar code 71 previously formed on the front side 70a of the dressing board 70 is formed at the corner portion 70c of the dressing board 70, so that is possible to ensure the large area R where the cutting blade 21 can be dressed. Further, according to the dressing method and the cutting apparatus 1, the groove code 72 is formed by the cutting blade 21 according to the bar code 71, so that it is unnecessary to prepare any apparatus for specifically forming the groove code 72. That is, the groove code 72 can be formed on the dressing board 70 by using the cutting apparatus 1 for cutting the workpiece W. Accordingly, the groove code 72 can be formed at low cost, and erroneous selection of the dressing board 70 can be easily prevented.

Further, according to the dressing board 70, the dressing method, and the cutting apparatus 1, the length L1 of the longest groove 72a in the groove code 72 is set shorter than the length L2 of the longest line 71b in the bar code 71. Accordingly, the area R where dressing is allowed as depicted in FIG. 11 can be reliably made larger than an area RA of a dressing board 70A depicted in FIG. 12 as a comparison. In the dressing board 70A as a comparison depicted in FIG. 12, the groove code 72 is not formed on the front side 70a, but only the bar code 71 is formed on the front side 70a. The area RA does not include the bar code 71, and the cutting blade 21 can be dressed in this area RA. In FIG. 12, the same parts as those depicted in FIG. 11 are denoted by the same reference numerals.

Accordingly, in the dressing board 70, the dressing method, and the cutting apparatus 1, the groove code 72 is composed of the plural grooves 72a shorter than the plural lines 71b constituting the bar code 71, so that the large area R for dressing the cutting blade 21 can be ensured and at the same time the kind of the dressing board 70 mounted in the cutting apparatus 1 can be identified.

The control unit 100 of the cutting apparatus 1 according to this preferred embodiment has a processing unit having a microprocessor such as CPU (central processing unit), a storing unit having a memory such as ROM (read only memory) and RAM (random access memory), and an input/output interface unit. The processing unit in the control unit 100 functions to perform processing (computing) according to a computer program stored in the storing unit and output a control signal for controlling the cutting apparatus 1 through the input/output interface unit to each component of the cutting apparatus 1. The functions of the control unit 100, the bar code determining section 102, and the groove code forming section 103 are realized by the processing unit in such a manner that the computer program stored in the storing unit is executed by the processing unit and that necessary information is stored into the storing unit by the processing unit. The function of the storing section 101 in the control unit 100 is realized by the storing unit.

The present invention is not limited to the above preferred embodiment. That is, various modifications may be made without departing from the scope of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A dressing board for dressing a cutting blade, the dressing board having a front side and a back side opposite to the front side, the back side of the dressing board being held on a chuck table in dressing the cutting blade, the dressing board comprising:
   a bar code formed on the front side of the dressing board for indicating kind information on the dressing board; and
   a groove code formed on the front side of the dressing board at an edge portion thereof, the groove code being composed of grooves having a pattern corresponding to that of the bar code;
   wherein even when the bar code is cut off by the cutting blade in dressing the cutting blade, the kind information on the dressing board is indicated by the groove code left on the front side of the dressing board.

2. The dressing board according to claim 1, wherein the kind information on the dressing board is indicated by using the width of each groove, the number of the grooves, the spacing between the grooves, and the length of each groove.

3. A cutting blade dressing method of dressing a cutting blade by using a dressing board having a front side and a back side opposite to the front side, the front side having a bar code for indicating kind information on the dressing board, the cutting blade dressing method comprising:
   a holding step of holding the dressing board on a chuck table in a condition where the front side of the dressing board is exposed;
   a dressing board recording step of imaging the bar code of the dressing board held on the chuck table and next recording the kind information on the dressing board as included in the bar code, to a control unit of a cutting apparatus;
   a groove code deciding step of deciding a pattern of a groove code to be formed on the front side of the dressing board at an edge portion thereof, according to the kind information recorded in the dressing board recording step;
   a groove code forming step of forming the pattern of the groove code decided in the groove code deciding step, on the front side of the dressing board at the edge portion by using the cutting blade; and
   a dressing step of cutting the front side of the dressing board after performing the groove code forming step, by using the cutting blade, thereby dressing the cutting blade.

4. A cutting apparatus comprising:
   a chuck table for holding a workpiece;
   an auxiliary chuck table for holding a dressing board having a front side on which a bar code is formed, the bar code indicating kind information on the dressing board;
   a cutting unit having a cutting blade for cutting the workpiece held on the chuck table;
   an imaging unit for imaging the workpiece held on the chuck table and also imaging the bar code of the dressing board; and
   a control unit for controlling the chuck table, the auxiliary chuck table, the cutting unit, and the imaging unit;
   the control unit including
      a bar code determining section for operating the imaging unit to image the bar code of the dressing board held on the auxiliary chuck table and determining the kind information on the dressing board as included in the bar code, and
      a groove code forming section for converting the kind information included in the bar code into a pattern of a groove code and forming the groove code corresponding to the bar code at an edge portion of the dressing board.

* * * * *